United States Patent
Thambidurai et al.

(10) Patent No.: US 10,304,758 B1
(45) Date of Patent: May 28, 2019

(54) WAFER LEVEL PACKAGE DEVICE FORMED USING A WAFER LEVEL LEAD FRAME ON A CARRIER WAFER HAVING A SIMILAR COEFFICIENT OF THERMAL EXPANSION AS AN ACTIVE WAFER

(71) Applicant: Maxim Integrated Products, Inc., San Jose, CA (US)

(72) Inventors: Karthik Thambidurai, Plano, TX (US); Ahmad Ashrafzadeh, Morgan Hill, CA (US); Viresh P. Patel, Austin, TX (US); Viren Khandekar, Flower Mound, TX (US)

(73) Assignee: MAXIM INTEGRATED PRODUCTS, INC, Omaha, NE (US)

( * ) Notice: Subject to any disclaimer, the term of this patent is extended or adjusted under 35 U.S.C. 154(b) by 0 days.

(21) Appl. No.: 13/788,291

(22) Filed: Mar. 7, 2013

(51) Int. Cl.
*H01L 23/00* (2006.01)
*H01L 23/495* (2006.01)

(52) U.S. Cl.
CPC .......... *H01L 23/4952* (2013.01); *H01L 24/81* (2013.01)

(58) Field of Classification Search
None
See application file for complete search history.

(56) References Cited

U.S. PATENT DOCUMENTS

| | | | | |
|---|---|---|---|---|
| 5,667,884 | A * | 9/1997 | Bolger | 428/323 |
| 6,316,289 | B1 * | 11/2001 | Chung | 438/118 |
| 6,333,469 | B1 * | 12/2001 | Inoue et al. | 174/260 |
| 2002/0094601 | A1 * | 7/2002 | Su et al. | 438/106 |
| 2009/0160039 | A1 * | 6/2009 | Wong | H01L 23/3107 257/673 |
| 2011/0285005 | A1 * | 11/2011 | Lin | H01L 21/4846 257/686 |
| 2012/0273929 | A1 * | 11/2012 | Jiang | H01L 23/49572 257/673 |

* cited by examiner

*Primary Examiner* — Thien F Tran
(74) *Attorney, Agent, or Firm* — Kevin West; Advent, LLP

(57) ABSTRACT

Techniques for forming a wafer level package device are disclosed. In one or more embodiments, the techniques include forming a wafer level lead frame on a carrier wafer and electrically connecting the wafer level lead frame to an active semiconductor wafer. The carrier wafer and the active semiconductor wafer have at least substantially the same coefficients of thermal expansion. The carrier wafer can be removed from the wafer level package device, and a number of connectors can be formed on the wafer level package device. The wafer level package device can be singulated to form chip packages, such as DFN or QFN packages.

5 Claims, 6 Drawing Sheets

WAFER LEVEL PACKAGE DEVICE FORMED USING A WAFER LEVEL LEAD FRAME ON A CARRIER WAFER HAVING A SIMILAR COEFFICIENT OF THERMAL EXPANSION AS AN ACTIVE WAFER

BACKGROUND

An ever present objective of semiconductor assembly is to provide packages for enclosing/encasing semiconductor components that are smaller, thinner, cooler, and less expensive to manufacture at a high rate of production. One type of semiconductor package is the Plastic Dual In-line Package (PDIP). Another type of semiconductor package is the gull-wing Small Outline (SO) package. These semiconductor packages generally include leads (connectors) extending from the sides of the package. Other types of semiconductor packages are flat lead-less packages, such as Dual Flat No-leads (DFN) and Quad Flat No-leads (QFN) packages. A DFN package has lead lands on only two sides of the perimeter of the package bottom, while a QFN package has lead lands on four sides of the package bottom.

Some DFN and QFN package sizes can range from one millimeter (1 mm) by two millimeter (2 mm) packages having three (3) lead lands, to ten millimeter (10 mm) by ten millimeter (10 mm) packages having sixty-eight (68) lead lands. Because the lead-frame is on the bottom of the package, flat no-lead packages can provide superior thermal performance when compared to leaded packages having similar body size and lead counts. Further, in a flat no-leads configuration, the die-attach-pad can be exposed on the bottom exterior of the package, allowing it to be soldered directly to a printed circuit board, and providing a direct route for heat to dissipate away from the package. The exposed die-attach-pad, often referred to as an exposed thermal pad, may greatly improve heat transfer out of the integrated circuit package and into the printed circuit board.

SUMMARY

Techniques for forming a wafer level package device are disclosed. In one or more embodiments, the techniques include forming a wafer level lead frame on a carrier wafer and electrically connecting the wafer level lead frame to an active semiconductor wafer. The carrier wafer and the active semiconductor wafer have at least substantially the same coefficients of thermal expansion. The carrier wafer can be removed from the wafer level package device, and a number of connectors can be formed on the wafer level package device. The wafer level package device can be singulated to form chip packages, such as DFN or QFN packages.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

Figure 3A:
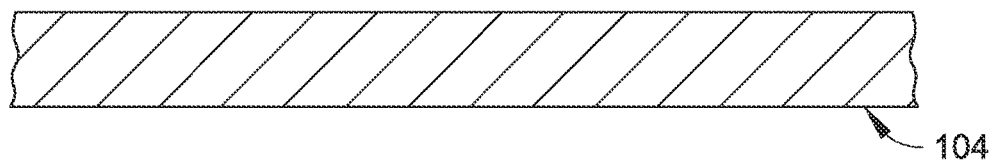
FIG. 3A is a cross-sectional side elevation view illustrating a carrier wafer for a wafer level package device, such as the wafer level package device illustrated in FIG. 1, in accordance with an example embodiment of the present disclosure.
Figure 3B:
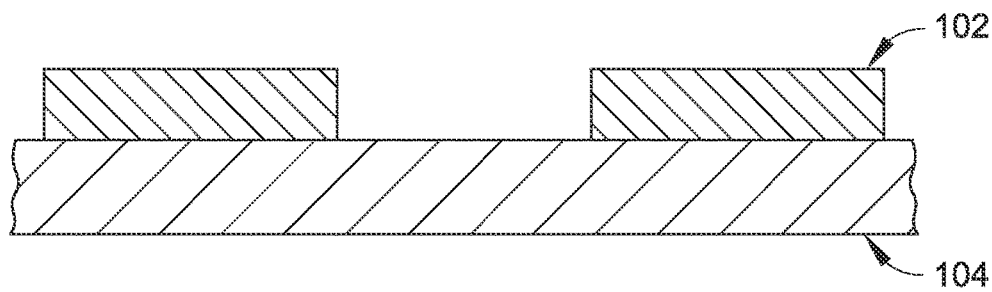
FIG. 3B is a cross-sectional side elevation view of the carrier wafer illustrated in FIG. 3A, where a wafer level lead frame is formed on the carrier wafer in accordance with an example embodiment of the present disclosure.
Figure 3C:
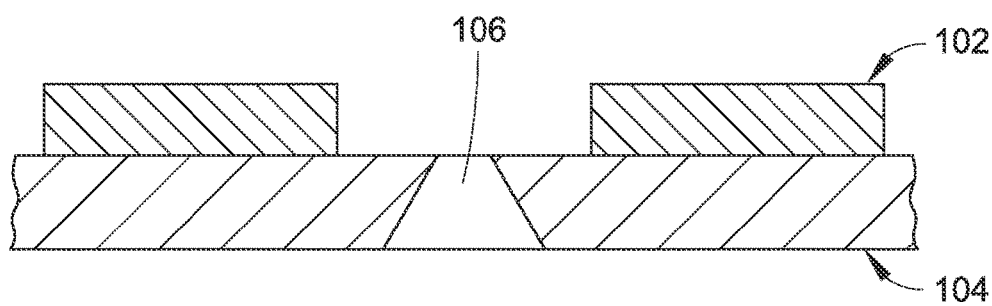
FIG. 3C is a cross-sectional side elevation view of the carrier wafer illustrated in FIG. 3A, where an aperture is formed in the carrier wafer in accordance with an example embodiment of the present disclosure.
Figure 4A:
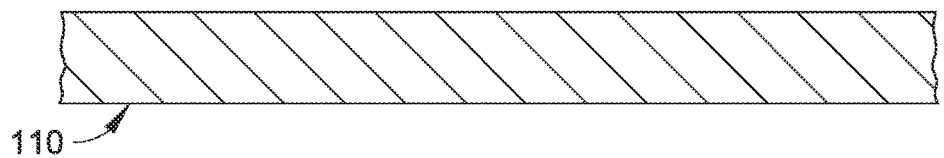
FIG. 4A is a cross-sectional side elevation view illustrating an active semiconductor wafer for a wafer level package device, such as the wafer level package device illustrated in FIG. 1, in accordance with an example embodiment of the present disclosure.
Figure 4B:
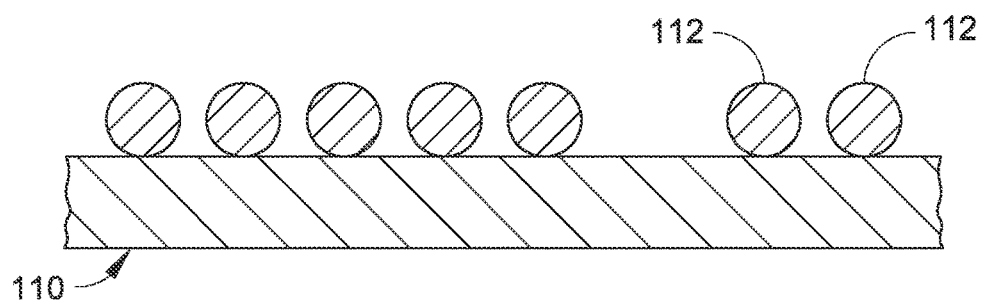
FIG. 4B is a cross-sectional side elevation view of the active semiconductor wafer illustrated in FIG. 3A, where solder bumps are formed on the active semiconductor wafer in accordance with an example embodiment of the present disclosure.
Figure 5A:
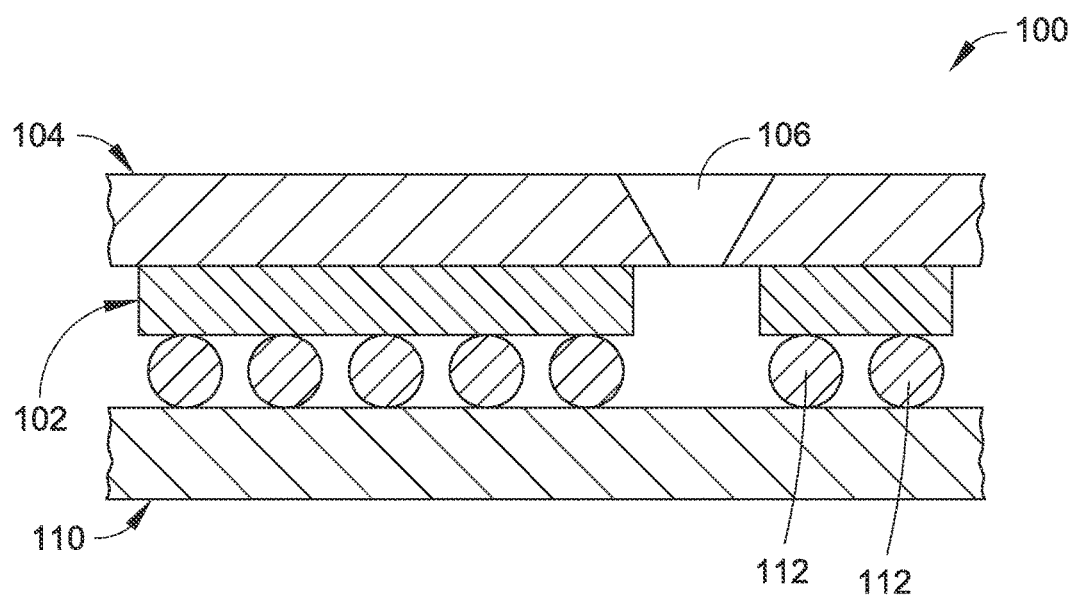

FIG. 5A is a cross-sectional side elevation view illustrating a wafer level package device formed by connecting a wafer level lead frame formed on a carrier wafer, such as the wafer level lead frame illustrated in FIGS. 3B and 3C, to an active semiconductor wafer, such as the active semiconductor wafer illustrated in FIGS. 4A and 4B, in accordance with an example embodiment of the present disclosure.

Figure 5B:
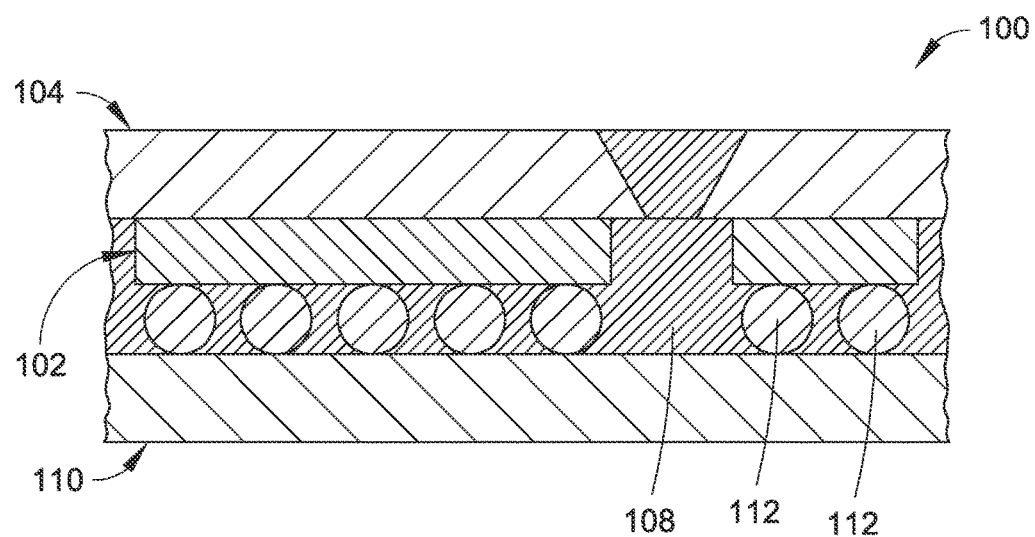

FIG. 5B is a cross-sectional side elevation view of the wafer level package device illustrated in FIG. 5A, where molding material is compression molded between the wafer level lead frame and the active semiconductor wafer in accordance with an example embodiment of the present disclosure.

Figure 5C:
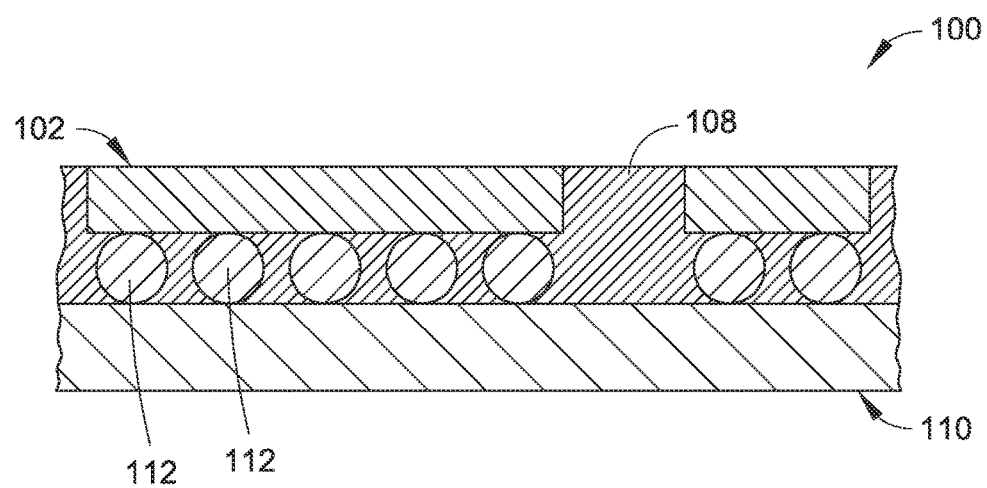

FIG. 5C is a cross-sectional side elevation view of the wafer level package device illustrated in FIG. 5A, where the carrier wafer is removed from the wafer level package device in accordance with an example embodiment of the present disclosure.

Figure 5D:
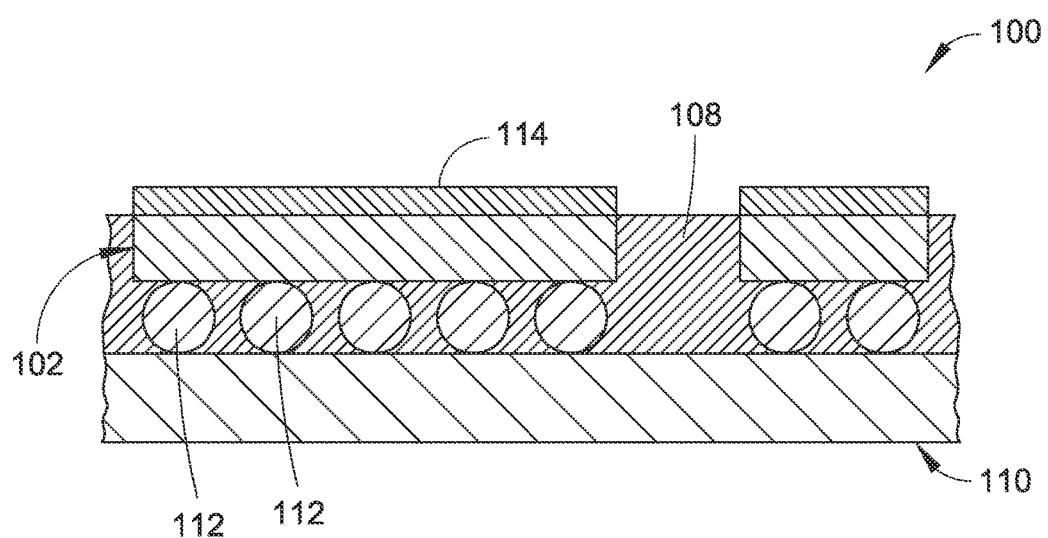

FIG. 5D is a cross-sectional side elevation view of the wafer level package device illustrated in FIG. 5A, where a connector is formed on the wafer level package device in accordance with an example embodiment of the present disclosure.

DETAILED DESCRIPTION

Overview

Flat no-leads Integrated Circuit (IC) packages, such as DFN (Dual Flat No-leads) packages and QFN (Quad Flat No-leads) packages, are used to physically and electrically connect ICs to printed circuit boards. The term "flat no-leads" is used to describe surface-mount technology allowing an IC to be connected to the surface of a Printed Circuit Board (PCB) without through-holes, and so on. Leadless connections/terminals (lead lands) and an exposed thermal pad are typically provided on the bottom of a flat no-leads IC package for connecting the package to a PCB. The lead lands are generally positioned at the perimeter of the package bottom, while the exposed thermal pad is located in the center of the package bottom, between the lead lands. Individual flat no-leads packages may be formed together, molded, and plated in a block format on a panel, and then singulated into separate devices after fabrication (e.g., by sawing or punching the packages out of the panel).

The present disclosure is directed to techniques for forming a wafer level package device that can be singulated to form a DFN chip package, a QFN chip package, and so forth. In embodiments of the disclosure, a wafer level lead frame is formed on a carrier wafer, and the wafer level lead frame is connected to an active semiconductor wafer to form a wafer level package device. Then, the carrier wafer can be removed (e.g., ground) from the wafer level package device (e.g., to expose the wafer level lead frame). Next, one or more connectors are formed on the wafer level package device, such as solder pads, electroless nickel immersion gold (ENIG) plating, conductive pillars, and so forth. The wafer level package device can then be singulated to form multiple chip packages, such as DFN chip packages, QFN chip packages, and so forth.

Techniques described herein can provide a small form-factor chip scale package (CSP) flat no-leads device at wafer level. For example, wafer level package devices as described herein can be used for highly integrated analog power devices (e.g., power field-effect transistors (FETS)) demanding higher efficiency and smaller size. Such devices can be used in applications including, but not necessarily limited to: power electronics, small form factor servers, laptops, disk drives, and so forth. Further, in accordance with the present disclosure, a wafer level lead frame and an active semiconductor wafer can be fabricated at the same time or substantially the same time (e.g., processed in parallel) to reduce manufacturing lead time. A reduction in warpage can be achieved by using substantially similar coefficients of thermal expansion (CTE) between the wafer level lead frame and the active semiconductor wafer. It should also be noted that a wafer level lead frame constructed in the manner described does not necessarily require tie-bar construction.

Example Implementations

Figure 1:
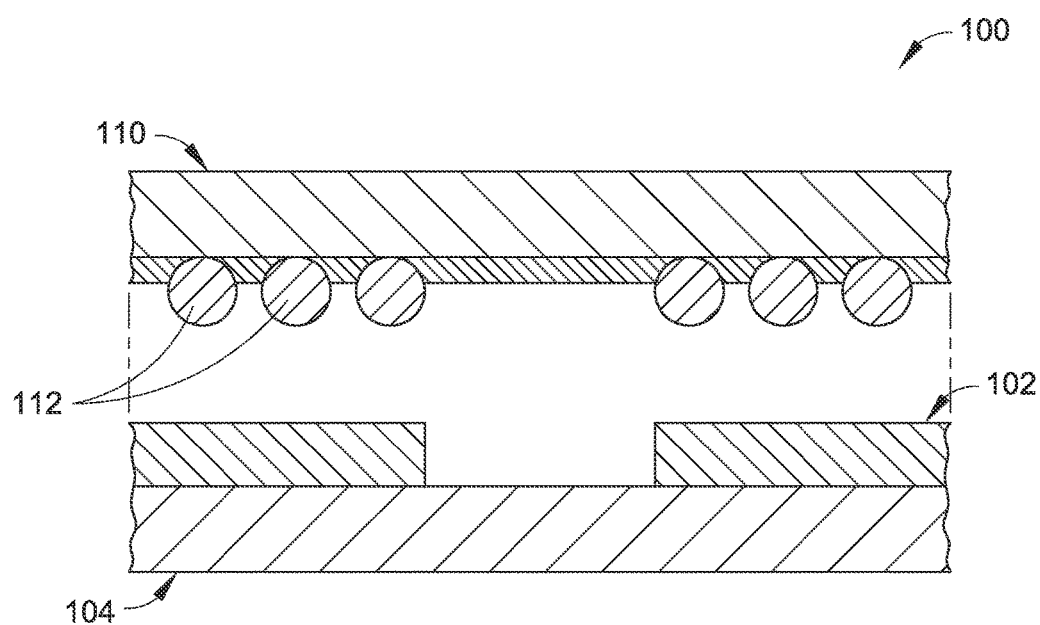
FIG. 1 is an exploded cross-sectional side elevation view illustrating a wafer level package device in accordance with an example embodiment of the present disclosure.

Referring to FIG. 1, a wafer level package device 100 is described. The wafer level package device 100 includes a wafer level lead frame 102 formed on a substrate (e.g., a carrier wafer 104). The wafer level lead frame 102 includes leads formed on the carrier wafer 104. The wafer level lead frame 102 is connected to an active semiconductor wafer 110 formed using another substrate. For example, the active semiconductor wafer 110 can include one or more solder bumps 112 configured to connect to the wafer level lead frame 102, and the wafer level lead frame 102 is electrically connected to the active semiconductor wafer 110 via, for example, the solder bumps 112. In embodiments of the disclosure, the carrier wafer 104 and the active semiconductor wafer 110 have similar or at least substantially the same CTE. The wafer level package device 100 can be singulated to form, for instance, DFN chip packages, QFN chip packages, and so forth. For example, the wafer level package device 100 has lead lands and/or an exposed thermal pad for connecting to a PCB.

As used herein, the term "substrate" refers to substrates constructed of materials such as, but not limited to: silicon, silicon dioxide, aluminum oxide, sapphire, germanium, gallium arsenide (GaAs), alloys of silicon and germanium, and/or indium phosphide (InP). Further, for the purposes of the present disclosure, a substrate can be formed as a semiconductor or an electrical insulator, and may include layers of both semiconducting and insulating material. For example, in implementations, a substrate can be formed using an insulator, such as silicon oxide, with a layer of semiconducting material, such as silicon formed thereupon. Electrical components, such as transistors and diodes, can be fabricated in the semiconductor. In other implementations, the substrate can be formed as an insulator, a dielectric, and so forth.

Example Fabrication Process

Figure 2:
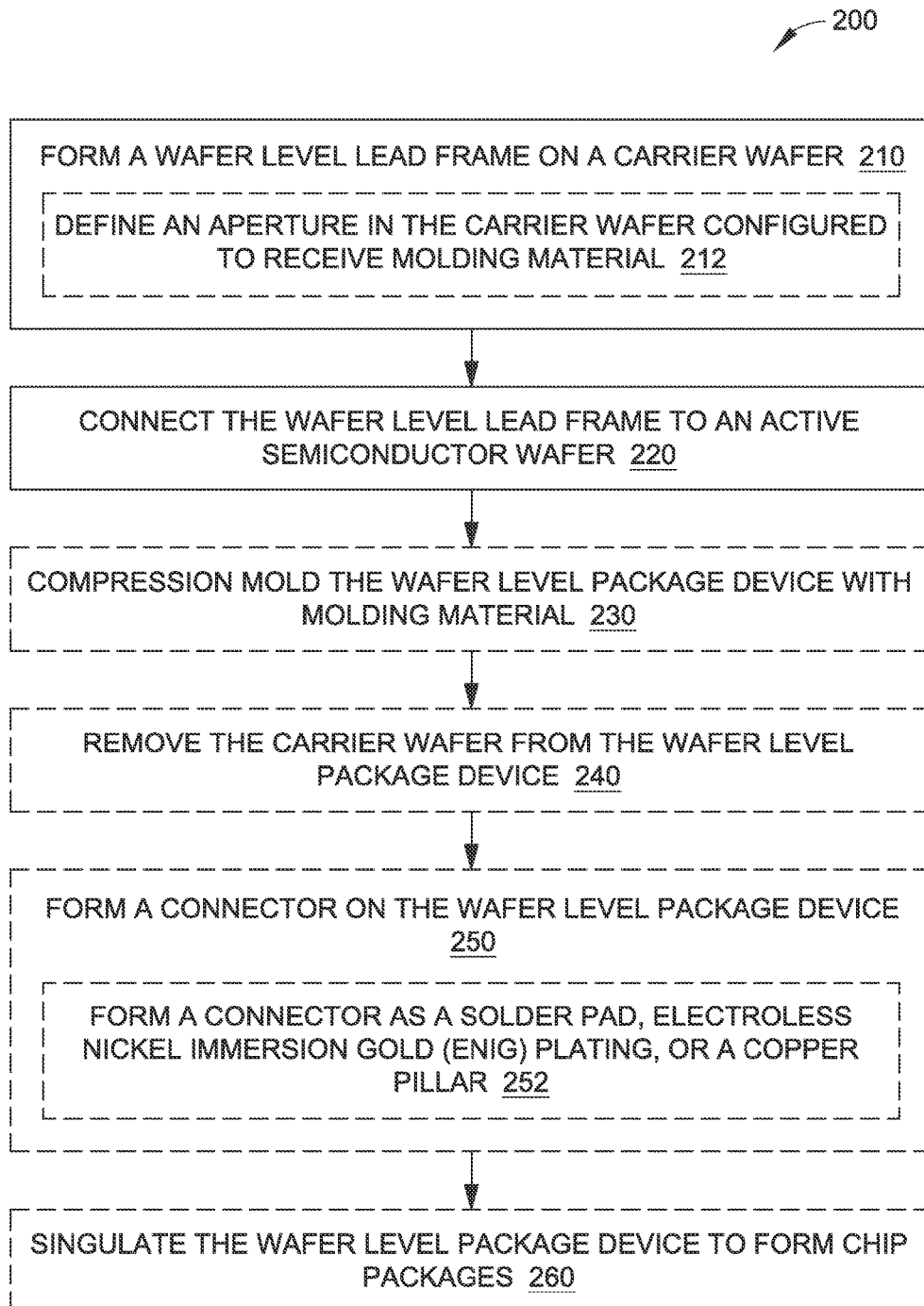
FIG. 2 is a flow diagram illustrating a method of forming a wafer level package device in accordance with an example embodiment of the present disclosure.

The following discussion describes example techniques for fabricating a wafer level package device, such as a wafer level package device that can be singulated to form a DFN or QFN semiconductor chip package, and so forth. FIG. 2 depicts a process 200, in an example implementation, for fabricating a wafer level package device, such as the example wafer level package device 100 illustrated in FIGS. 1 and 5A through 5D and described above. In the process 200 illustrated, a wafer level lead frame is formed on a carrier wafer (Block 210). For example, with reference to FIGS. 3A through 3C, wafer level lead frame 102 is formed on carrier wafer 104. The wafer level lead frame 102 can include metal (e.g., copper) leads plated on the carrier wafer 104. In some embodiments, one or more apertures (e.g., channels) are defined in the carrier wafer for receiving molding material (Block 212). For instance, with continuing reference to FIGS. 3A through 3C, the carrier wafer 104 defines an aperture 106 configured to receive molding material 108, such as epoxy molding material, and so forth. In some embodiments, one or more apertures 106 are laser cut in the carrier wafer 104 (e.g., in locations on the carrier wafer 104 that are not otherwise used).

Next, the wafer level lead frame is connected to an active semiconductor wafer (Block 220). For example, with reference to FIGS. 4A and 4B, an active semiconductor wafer 110 is fabricated. The active semiconductor wafer 110 can include one or more solder bumps 112 configured to connect to the wafer level lead frame 102. With reference to FIGS. 5A through 5D, the wafer level lead frame 102 is electrically connected to the active semiconductor wafer 110 via, for example, the solder bumps 112. For example, the carrier wafer 104 is attached to the active semiconductor wafer 110 and reflowed.

In embodiments of the disclosure, the wafer level package device is compression molded with molding material (Block 230). For instance, with continuing reference to FIGS. 5A through 5D, epoxy molding material 108 is compression molded into the space between the wafer level lead frame 102 and the active semiconductor wafer 110 via, for example, aperture 106. Next, the carrier wafer can be removed from the wafer level package device (Block 240). For instance, with continuing reference to FIGS. 5A through 5D, carrier wafer 104 is removed (e.g., ground) from wafer level package device 100 to expose the wafer level lead frame 102.

In embodiments of the disclosure (e.g., after the carrier wafer is removed from the wafer level package device), one or more connectors are formed on the wafer level package device (Block 250). For example, with continuing reference to FIGS. 5A through 5D, connectors 114 are formed on the wafer level package device 100. In some embodiments, one or more connectors are formed as a solder pad, an electroless nickel immersion gold (ENIG) plating, a conductive pillar, and so forth. For instance, with reference to FIGS. 5A through 5D, one or more of the connectors 114 is formed as a solder pad.

In embodiments where a connector 114 comprises a conductive pillar, one or more conductive pillars can be formed as pillars comprising copper or another conductive material. In embodiments, the pillars can be formed with a dry film photo process. The dry film photo process may include forming a seed layer of a conductive material, such as copper, on the wafer level package device 100. Then, a dry film may be laminated onto the seed layer. Next, a negative photoresist process may be used to photoexpose the shapes of the pillars into the dry film and create holes to the seed layer. Then, the pillars may be electroplated from the bottom up by depositing the conductive material in the holes in the dry film. It should be noted that the dry film photo process is provided by way of example only and is not meant to be restrictive of the present disclosure. Thus, conductive pillars may be formed using other fabrication techniques, conductive materials, and so forth.

In some embodiments, the wafer level package device is singulated to form chip packages (Block 260). For example, with continuing reference to FIGS. 5A through 5D, the wafer level package device 100 can be singulated to form, for instance, DFN chip packages, QFN chip packages, and so forth.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer level package device comprising:
   a wafer level lead frame formed on a first substrate, the the first substrate configured to be attached to a removable non-metal carrier wafer comprising at least one of a semiconductor or an insulator, the removable non-metal carrier wafer having a first coefficient of thermal expansion, the removable non-metal carrier wafer having one or more apertures configured to receive an epoxy molding material; and
   a second substrate formed from an active semiconductor wafer, the second substrate electrically and mechanically connected to the wafer level lead frame by a plurality of solder bumps, the active semiconductor wafer having a second coefficient of thermal expansion at least substantially similar to the first coefficient of thermal expansion, where the epoxy molding material is compression molded in a space between the wafer level lead frame and the second substrate about the plurality of solder bumps via the one or more apertures in the non-metal carrier wafer;
   the wafer level lead frame comprising a plurality of connectors that are configured to be exposed after the removable non-metal carrier wafer has been removed to furnish electrical connectivity to the second substrate, wherein the epoxy molding material is disposed below the plurality of connectors.

2. The wafer level package device as recited in claim 1, wherein the removable non-metal carrier wafer is configured to be removed from the wafer level package device.

3. The wafer level package device as recited in claim 1, wherein the wafer level package device is configured to be singulated to form a plurality of chip packages.

4. The wafer level package device as recited in claim 1, wherein at least one of the plurality of connectors formed on the wafer level package device comprises electroless nickel immersion gold (ENIG) plating.

5. The wafer level package device as recited in claim 1, wherein the removable non-metal carrier wafer comprises at least one aperture for receiving the epoxy molding material.

\* \* \* \* \*